United States Patent
Hong

(10) Patent No.: US 9,430,032 B2
(45) Date of Patent: Aug. 30, 2016

(54) DRIVER CIRCUIT OF SEMICONDUCTOR APPARATUS

(71) Applicant: SK hynix Inc., Icheon-si, Gyeonggi-do (KR)

(72) Inventor: Yun Seok Hong, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 318 days.

(21) Appl. No.: 14/076,664

(22) Filed: Nov. 11, 2013

(65) Prior Publication Data

US 2015/0046722 A1 Feb. 12, 2015

(30) Foreign Application Priority Data

Aug. 9, 2013 (KR) .................. 10-2013-0094569

(51) Int. Cl.
*H03B 1/00* (2006.01)
*H03K 3/00* (2006.01)
*G06F 1/32* (2006.01)
*H03K 19/0185* (2006.01)

(52) U.S. Cl.
CPC ..... *G06F 1/3287* (2013.01); *H03K 19/018507* (2013.01); *Y02B 60/1282* (2013.01); *Y02B 60/32* (2013.01)

(58) Field of Classification Search
CPC .............................. G06F 1/3287; H03K 3/012

USPC ................ 327/108–112, 427, 434, 437, 333, 327/378–388, 141–143; 326/82, 83, 87; 713/300
See application file for complete search history.

(56) References Cited

U.S. PATENT DOCUMENTS

| 2004/0094778 | A1* | 5/2004 | Ooishi ................ G11C 11/16 257/202 |
| 2005/0122155 | A1* | 6/2005 | Tanaka ............. H03K 3/356104 327/333 |
| 2007/0150770 | A1* | 6/2007 | Lee ........................ G11C 5/143 713/323 |
| 2010/0027332 | A1* | 2/2010 | Lee .................... G11C 16/0483 365/185.03 |

FOREIGN PATENT DOCUMENTS

KR 1020120111284 A 10/2012

* cited by examiner

*Primary Examiner* — Lincoln Donovan
*Assistant Examiner* — Thomas Skibinski
(74) *Attorney, Agent, or Firm* — William Park & Associates Ltd.

(57) ABSTRACT

Provided is a driver circuit of a semiconductor apparatus that is capable of operating with improved reliability and consuming less current. The driver circuit comprises a driver configured to generate an internal voltage using a power voltage in response to a control voltage and a controller configured to change the control voltage to a level higher than a level of the power voltage in response to a stand-by mode signal.

17 Claims, 2 Drawing Sheets

DRIVER CIRCUIT OF SEMICONDUCTOR APPARATUS

CROSS-REFERENCES TO RELATED APPLICATION

The present application claims priority under 35 U.S.C. §119(a) to Korean application number 10-2013-0094569, which was filed on Aug. 9, 2013, in the Korean Intellectual Property Office, which is incorporated herein by reference in its entirety.

BACKGROUND

1. Technical Field

Various embodiments relate to a semiconductor apparatus, and more particularly, to a driver circuit of a semiconductor apparatus.

2. Related Art

Semiconductor apparatuses are fundamentally required to exhibit high energy efficiency, low heat generation, and the ability to operate for long periods of time.

Particularly, mobile products that operate using batteries are evaluated in the market mainly on the basis of their low heat generation characteristics.

Therefore, there is a need to improve operation reliability and current consumption reduction of driver circuits for semiconductor apparatuses.

SUMMARY

A driver circuit of a semiconductor apparatus that operates with improved reliability and consumes less current is described herein.

In an embodiment of the present invention, a driver circuit comprises a driver configured to generate an internal voltage using a power voltage in response to a control voltage and a controller configured to change the control voltage to a level higher than a level of the power voltage in response to a stand-by mode signal.

In an embodiment of the present invention, a driver circuit comprises a controller configured to generate a control voltage between a first power voltage and a second power voltage in response to a stand-by mode signal and a driver configured to have a source that is provided with the second power voltage, a drain, from which an internal voltage is output, and a gate that is provided with the control voltage.

BRIEF DESCRIPTION OF THE DRAWINGS

Features, aspects, and embodiments are described in conjunction with the attached drawing, in which.

DETAILED DESCRIPTION

Hereinafter, a driver circuit of a semiconductor apparatus will be described below with reference to the accompanying drawings through example embodiments.

Figure 1:
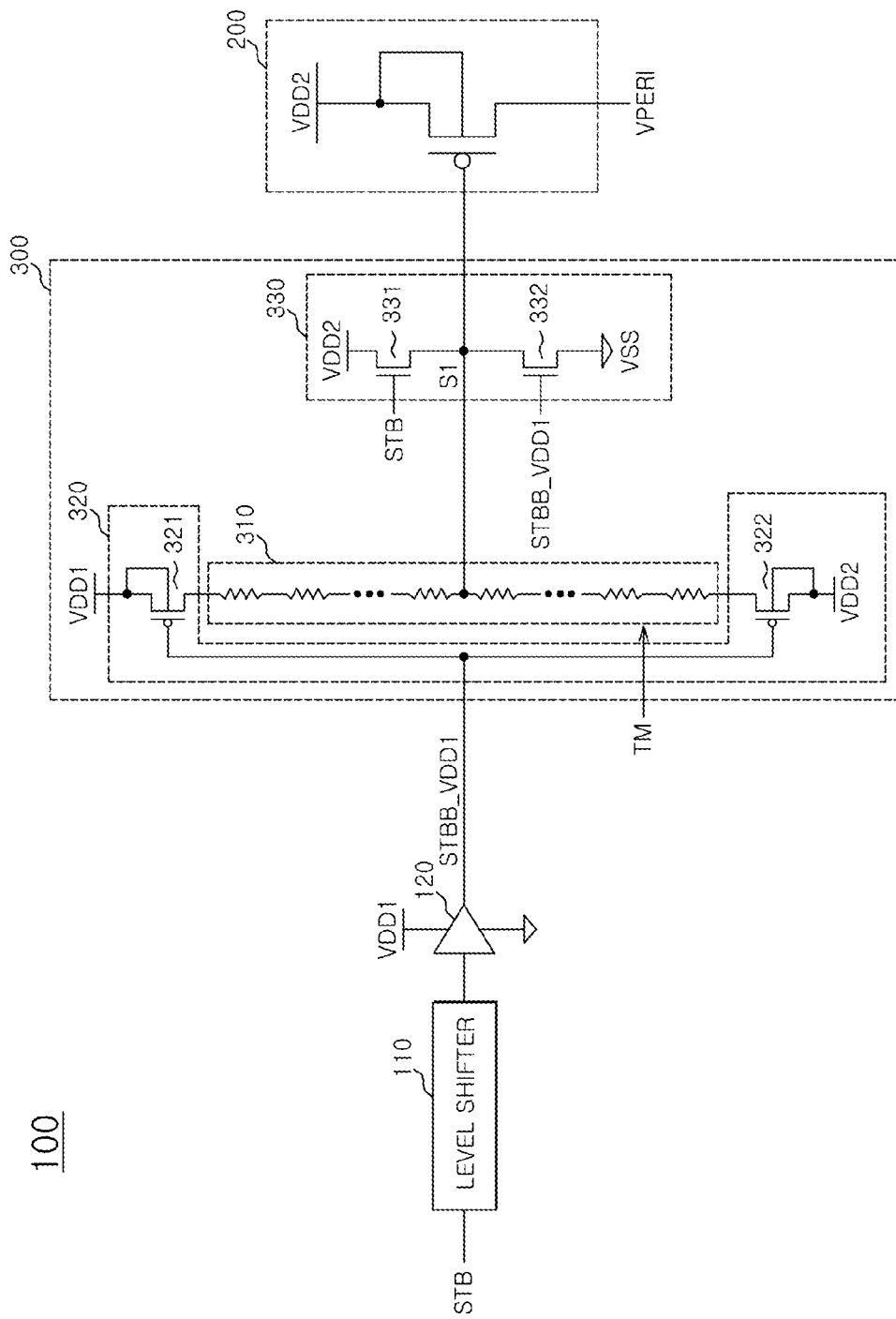
FIG. 1 is a circuit diagram illustrating a driver circuit according to an embodiment of the present invention.

FIG. 1 is a circuit diagram illustrating a driver circuit according to an embodiment of the present invention.

Referring to FIG. 1, the driver circuit 100 may include a level shifter 110, an inverter 120, a driver 200 and a controller 300.

The level shifter 110 may shift the level of a stand-by mode signal STB from a second power voltage VDD2 to a first power voltage VDD1.

For example, the first power voltage VDD1 may be 1.8V and the second power voltage VDD2 may be 1.2V.

The stand-by mode signal STB may be enabled in a deep power down (DPD) mode.

The stand-by mode signal STB may also be enabled in a stand-by mode or a self-refresh mode.

The inverter 120 may generate an inverted stand-by mode signal STBB_VDD1 by inverting the stand-by mode signal STB, which has passed through the level shifter 110.

The driver 200 may be turned on and off in response to a control voltage. The control voltage may be a voltage of a control voltage node S1. When the driver 200 is turned on, the driver 200 may output the second power voltage VDD2 as an internal voltage, for example a peripheral circuit voltage VPERI. When the driver 200 is turned off, the driver 200 may block a current path of an output terminal.

The driver 200 may comprise a PMOS transistor.

A source of the driver 200 may be provided with the second power voltage VDD2, and the source of the driver 200 may be electrically coupled with a bulk terminal. A drain of the driver 200 may output the internal voltage. A gate of the driver 200 may be provided with the control voltage via the control voltage node S1.

The controller 300 may include a dividing resistance block 310, a first switching block 320 and a second switching block 330.

The controller 300 may vary the control voltage in response to the stand-by mode signal STB and the inverted stand-by mode signal STBB_VDD1.

The controller 300 in the stand-by mode, in which the stand-by mode signal STB is enabled, may change the control voltage to a level higher than the second power voltage VDD2, so that a negative bias is applied to the driver 200.

The controller 300, in another mode, in which the stand-by mode signal STB is not enabled, may change the control voltage to a level that turns on the driver 200.

The dividing resistance block 310 may divide the first power voltage VDD1 and the second power voltage VDD2 by a preset ratio to change the control voltage to a level that is higher than that of the second power voltage VDD2.

The dividing resistance block 310 may include a plurality of resistors that are electrically coupled in series.

The preset ratio may vary according to a test mode signal TM.

The first switching block 320 may electrically couple the first power voltage VDD1 and the second power voltage VDD2 to the dividing resistance block 310 when the stand-by mode signal STB is enabled, that is when the inverted stand-by mode signal STBB_VDD1 is logic low.

The first switching block 320 may include a first switch 321 and a second switch 322. The first switch 321 may be electrically coupled between the first power voltage VDD1 and one end of the dividing resistance block 310. The second switch 322 may be electrically coupled between the second power voltage VDD2 and an other end of the dividing resistance block 310.

The first switch 321 may comprise a PMOS transistor. A source of the first switch 321 may be provided with the first power voltage VDD1. A drain of the first switch 321 may be electrically coupled to the one end of the dividing resistance block 310. A gate of the first switch 321 may be provided with the inverted stand-by mode signal STBB_VDD1.

The second switch 322 may comprise a PMOS transistor. A source of the second switch 322 may be provided with the second power voltage VDD2. A drain of the second switch 322 may be electrically coupled to the other end of the dividing resistance block 310. A gate of the second switch 322 may be provided with the inverted stand-by mode signal STBB_VDD1.

The second switching block 330 may include a first switch 331 and a second switch 332. The first switch 331 may be electrically coupled between the second power voltage VDD2 and the control voltage node S1. The second switch 332 may be electrically coupled between a ground voltage VSS and the control voltage node S1.

The second switching block 330 may change the control voltage to a level corresponding to the second power voltage VDD2, when the stand-by mode signal STB is enabled. The stand-by mode signal STB may be enabled when the stand-by mode signal STB is logic high.

The second switching block 330 may change the control voltage to the ground voltage VSS when the stand-by mode signal STB is disabled, that is when the inverted stand-by mode signal STBB_VDD1 is logic high.

The first switch 331 may comprise an NMOS transistor. A source of the first switch 331 may be provided with the second power voltage VDD2. A drain of the first switch 331 may be electrically coupled to the control voltage node S1. A gate of the first switch 331 may be provided with the stand-by mode signal STB.

The second switch 332 may comprise an NMOS transistor. A source of the second switch 332 may be electrically coupled to the ground voltage VSS. A drain of the second switch 332 may be electrically coupled to the control voltage node S1. A gate of the second switch 332 may be provided with the inverted stand-by mode signal STBB_VDD1.

The control voltage node S1 may be electrically coupled to a gate of the driver 200.

The following is an explanation of the operation of the driver circuit 100 in accordance with an embodiment of the present invention.

In a normal mode, in which the stand-by mode signal STB is logic low, that is, disabled, the first switch 321 and the second switch 322 are turned off.

Further in the normal mode, the stand-by mode signal STB may be a logic low. According to the stand-by mode signal STB the first switch 331 of the second switching block 330 is turned off and the second switch 332 of the second switching block 330 is turned on.

When the second switch 322 of the second switching block 330 is turned on, the control voltage node S1 is at the level of the ground voltage VSS.

When the control voltage node S1 is at the level of the ground voltage VSS, the driver 200 is turned on and outputs the second power voltage VDD2 as the peripheral circuit voltage VPERI.

In the stand-by mode, in which the stand-by mode signal STB is logic high and thus enabled, the first switch 321 and the second switch 322 of the first switching block 320 are turned on.

Since the stand-by mode signal STB is logic high, the first switch 331 of the second switching block 330 is turned on and the second switch 332 of the second switching block 330 is turned off.

The voltage level of the control voltage node S1 rises to the level of a threshold voltage Vth of the first switch 331 subtracted from the second power voltage VDD2, and thus turns on the driver 200 when the first switch 331 of the second switching block 330 is turned on.

Since the first switch 321 and the second switch 322 of the first switching block 320 are turned on, the voltage level of the control voltage node S1 rises to a level between the first power voltage VDD1 and the second power voltage VDD2 due to the dividing resistance block 310. In other words, the controller 300 may be configured to generate a control voltage between the first power voltage VDD1 and the second power voltage VDD2 in response to a stand-by mode signal STB.

The voltage level of the control voltage node S1 may be 1.5V when the preset ratio of the dividing resistance block 310 is 1:1, the first power voltage VDD1 is 1.8V and the second power voltage VDD2 is 1.2V.

A negative bias of −0.3V may be applied to the gate of the driver 200 because the voltage level of the source of the driver 200 is the second power voltage VDD2 or 1.2V and the voltage level of the control voltage node S1 is 1.5V. In other words, the controller 300 may be configured to apply a negative bias to the gate of the driver 200. Further, a level of the negative bias may be dependent on the preset ratio of the dividing resistance block 310.

If a negative bias of −0.1V is applied to the gate of the driver 200, a turn-off current Ioff of the driver 200, which is a current running through the turned-off driver 200, may be reduced to a level of 0.1. Thus, a level of the negative bias may affect the turn-off current of the driver 200. By extension, the turn-off current Ioff of the driver 200 changes based on the preset ratio of the dividing resistance block 310.

Therefore, when the negative bias of −0.3V is applied to the gate of the driver 200, the turn-off current Ioff of the driver 200 may be reduced to a level of 0.001.

It should be noted that a level of the negative bias needs to be adjusted appropriately for prompt operation when changing the mode from the stand-by mode to the normal mode. According to an embodiment of the present invention, the driver circuit is capable of adjusting the level of the negative bias by adjusting the preset ratio of the dividing resistance block 310.

According to an embodiment of the present invention, when entering into the stand-by mode, the driver circuit 100 may promptly turn off the driver 200 through the first switch 331 of the second switching block 330 and minimize the turn-off current by applying negative bias to the gate of the driver 200 through the first switching block 320 and the dividing resistance block 310.

Figure 2:
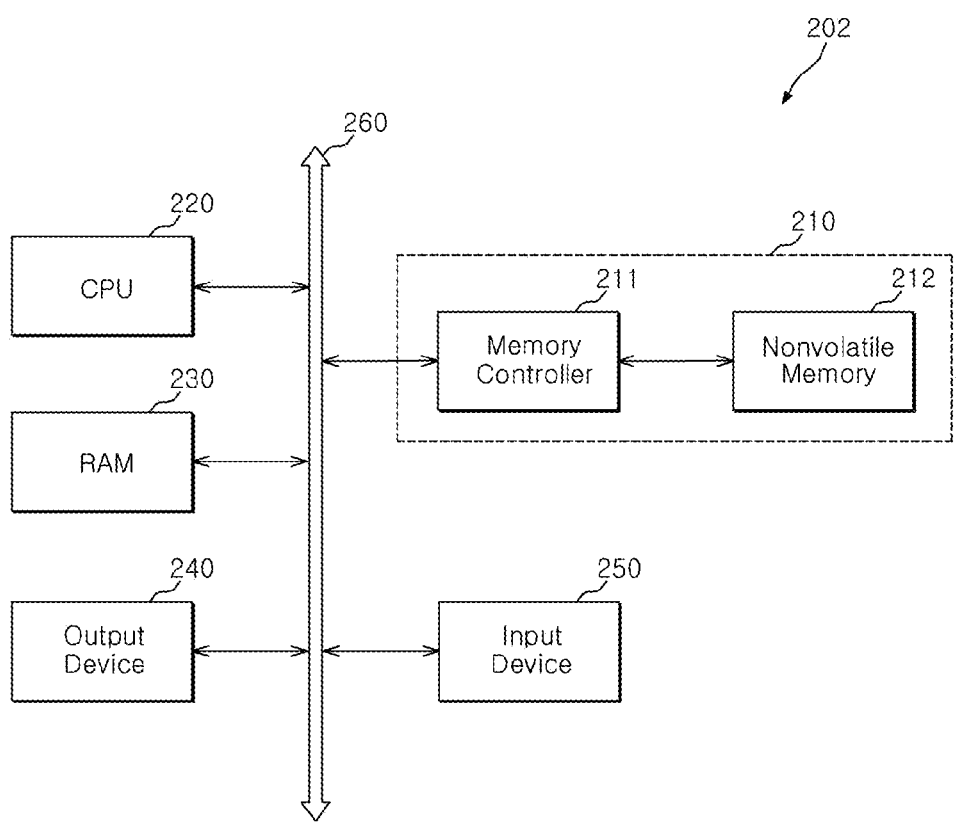
FIG. 2 is a view illustrating an electronic device according to one embodiment of the present invention.

FIG. 2 is a view illustrating an electronic device according to one embodiment of the present invention.

In FIG. 2, the electronic device 202 of the present embodiment may include a CPU 220 connected electrically to a system bus 260, a RAM 230, an output device 240, an input device 250 and a memory system 210. In the event that the electronic device 202 is a portable electronic device, a battery (not shown) for supplying an operating voltage to the electronic device 202 may be provided. The electronic device 202 of the present invention may further include an application chipset, a CMOS image processor CIS, a mobile DRAM, etc.

The output device 240 may be a self-contained display in the case of a portable electronic device. The input device 250 may be a physical keyboard or a virtual keyboard in the case of a portable electronic device, and may further include, without limitation, a trackball, touchpad, or other cursor control device combined with a selection control, such as a pushbutton, to select an item highlighted by cursor manipulation.

Any one of the memory system 210, CPU 220, RAM 230, output device 240, or input device 250 may include a driver circuit as described in conjunction with FIG. 1.

While certain embodiments have been described above, it will be understood to those skilled in the art that the embodiments described are by way of example only. Accordingly, the driver circuit described herein should not be limited based on the described embodiments. Rather, the driver circuit described herein should only be limited in light of the claims that follow when taken in conjunction with the above description and accompanying drawings.

What is claimed is:

1. A driver circuit comprising:
   a controller configured to change a level of a control voltage to any one of levels between a first power voltage and a second power voltage in response to a stand-by mode signal; and
   a driver configured to generate an internal voltage using the second power voltage in response to the control voltage,
   wherein the controller includes:
   a dividing resistance block configured to change a level of the control voltage by dividing the first power voltage and the second power voltage by a preset ratio; and
   a first switching block configured to electrically couple the first power voltage and the second power voltage to the dividing resistance block when the stand-by mode signal is enabled.

2. The driver circuit of claim 1, wherein the driver generates the internal voltage or blocks a current path of an output terminal according to the control voltage.

3. The driver circuit of claim 1, wherein a source of the driver is provided with the second power voltage, a drain of the driver outputs the internal voltage and a gate of the driver is provided with the control voltage.

4. The driver circuit of claim 1, wherein the controller changes the control voltage when the stand-by mode signal is enabled.

5. The driver circuit of claim 1, wherein the preset ratio of the dividing resistance block varies according to a test mode signal.

6. The driver circuit of claim 1, wherein the controller further includes a second switching block configured to change the control voltage to a level corresponding to the second power voltage when the stand-by mode signal is enabled.

7. The driver circuit of claim 6, wherein the second switching block changes the control voltage to a level lower than a level of the second power voltage when the stand-by mode signal is disabled.

8. The driver circuit of claim 1, further comprising:
   a level shifter configured to shift a level of the stand-by mode signal from the second power voltage to the first power voltage.

9. A driver circuit comprising:
   a controller configured to change a level of a control voltage to any one of levels between a first power voltage and a second power voltage in response to a stand-by mode signal;
   a driver configured to have a source that is provided with the second power voltage, a drain, from which an internal voltage is output, and a gate that is provided with the control voltage,
   a level shifter configured to shift a level of the stand-by mode signal from the second power voltage to the first power voltage,
   a dividing resistance block configured to divide the first power voltage and the second power voltage by a preset ratio to change the control voltage to a level higher than a level of the second power voltage; and
   a first switching block configured to electrically couple the first power voltage and the second power voltage to the dividing resistance block when the stand-by mode signal is enabled.

10. The driver circuit of claim 9, wherein a level of the first power voltage is higher than the level of the second power voltage.

11. The driver circuit of claim 9, wherein the preset ratio of the dividing resistance block varies according to a test mode signal.

12. The driver circuit of claim 9, wherein the controller further includes a second switching block configured to change the control voltage to a level corresponding to the second power voltage when the stand-by mode signal is enabled.

13. The driver circuit of claim 12, wherein the second switching block changes the control voltage to a level of a ground voltage when the inverted stand-by mode signal is enabled.

14. The driver circuit of claim 9, wherein the dividing resistance block comprises a plurality of resistors that are electrically coupled in series.

15. The driver circuit of claim 9, wherein the controller is configured to apply a negative bias to the gate of the driver.

16. An electronic device comprising:
   a CPU;
   random access memory;
   an input device;
   an output device;
   a memory controller; and
   a driver circuit configured to generate an internal voltage using a second power voltage in response to a control voltage,
   wherein a level of the control voltage is changed to any one of levels between a first power voltage and the second power voltage in response to a stand-by mode signal,
   wherein the driver circuit includes:
   a dividing resistance block configured to change a level of the control voltage by dividing the first power voltage and the second power voltage by a preset ratio; and
   a first switching block configured to electrically couple the first power voltage and the second power voltage to the dividing resistance block when the stand-by mode signal is enabled.

17. The electronic device of claim 16, further comprising:
   a level shifter configured to shift a level of the stand-by mode signal from the second power voltage to the first power voltage.

* * * * *